United States Patent
Van De Weil et al.

(10) Patent No.: US 7,928,567 B2
(45) Date of Patent: Apr. 19, 2011

(54) POWER SUPPLY NETWORK

(75) Inventors: Petrus J. A. M. Van De Weil, Utrecht (NL); Andrew T. Appleby, Southhampton (GB)

(73) Assignee: NXP B.V., Eindhoven (NL)

( * ) Notice: Subject to any disclaimer, the term of this patent is extended or adjusted under 35 U.S.C. 154(b) by 267 days.

(21) Appl. No.: 12/306,898

(22) PCT Filed: Jun. 19, 2007

(86) PCT No.: PCT/IB2007/052354
§ 371 (c)(1),
(2), (4) Date: Dec. 29, 2008

(87) PCT Pub. No.: WO2008/004151
PCT Pub. Date: Jan. 10, 2008

(65) Prior Publication Data
US 2009/0289372 A1    Nov. 26, 2009

(30) Foreign Application Priority Data
Jun. 30, 2006    (EP) .................................... 06116377

(51) Int. Cl.
*H01L 23/528*    (2006.01)
(52) U.S. Cl. ................. 257/750; 257/773; 257/E23.151
(58) Field of Classification Search ........... 257/E21.585, 257/750, 773, 691, E23.151; 438/614
See application file for complete search history.

(56) References Cited

U.S. PATENT DOCUMENTS

| | | | |
|---|---|---|---|
| 5,767,011 A * | 6/1998 | Yao et al. ...................... | 438/618 |
| 6,649,509 B1 * | 11/2003 | Lin et al. ...................... | 438/618 |
| 6,809,419 B2 | 10/2004 | Minami et al. | |
| 7,135,759 B2 | 11/2006 | Efland et al. | |
| 7,230,340 B2 | 6/2007 | Lin | |
| 7,335,992 B2 | 2/2008 | Anzai | |

FOREIGN PATENT DOCUMENTS
EP    1143513 A1    10/2001

OTHER PUBLICATIONS

Buffet, Patrick H. et al. "Methodology for I/O Cell Placement and Checking in ASIC Designs Using Area-Array Power Grid." (IEEE 2000 Custom Integrated Circuit Conference). IBM Microelectronics Division, Essex Junction, VT 05452 USA. Third Quarter, pp. 125-128.

Yao, Chinghi, et al. "An Efficient Power Routing Technique to Resolve the Current Crowding Effect in the Power Grid Structure of Gate Arrays." OKI Semiconductor, 785 North Mary Avenue, Sunnyvale, CA 94086, pp. 134-137.

* cited by examiner

*Primary Examiner* — Roy K Potter

(57) ABSTRACT

A power supply network (2) for an integrated circuit is provided, the power supply network (2) comprising a supply grid (4); a plurality of supply pads (6), each supply pad (6) being in electrical contact with an edge of the supply grid (4); a current spreader (8) for at least one of the plurality of supply pads (6), each current spreader (8) being in electrical contact with a respective supply pad (6) and the supply grid (4), each current spreader (8) being sized so that it overlaps with a respective portion of the supply grid (4); and each current spreader (8) having a lower electrical resistance than the supply grid (4). Further embodiments provide an integrated circuit with a power supply network as described above.

21 Claims, 6 Drawing Sheets

POWER SUPPLY NETWORK

TECHNICAL FIELD OF THE INVENTION

The invention relates to an integrated circuit, and in particular relates to an improved power supply network for an integrated circuit.

BACKGROUND TO THE INVENTION

In an integrated circuit or a system-on-chip (SoC), a power supply network is provided to supply the components in the circuit with power from an external power supply. A conventional power supply network consists of a power network and a ground network.

A power supply network is characterized by its structure or topology, i.e. metal layers used, grid structure versus tree structures or combinations of these, distances between wires and/or grid meshes, and the width of the wires. Supply pads and a peripheral supply ring surrounding the internal grid structure are also considered to be part of the power supply network.

Power integrity is a key parameter in characterising and controlling integrated circuit and SoC functionality and performance. The decreasing component sizes in deep sub-micron technologies allows packing densities to be increased with more functional blocks in an integrated circuit, with the supply and threshold voltages in the circuit being reduced accordingly. On the other hand, the switching current and switching speed increase. A consequence of decreasing the supply voltage is that the acceptable level of voltage drop in the power supply network also decreases. However, the actual voltage drop increases due to increased resistance in the power supply network from thinner wires, and increased supply current levels. A similar effect to voltage drop in the power network occurs in the ground network, and is called voltage rise. Voltage drop in the power supply network comprises both voltage drop in the power network and voltage rise in the ground network.

One conventional way of reducing the voltage drop (otherwise known as the IR-drop, from V=IR) across the power supply network for an integrated circuit is to widen all of the wires of the power supply network. This results in the resistance of these wires being reduced. However, this also uses routing resources which could otherwise be used for signal and clock wires.

In reducing the IR-drop to specified limits, the area occupied by the supply grid in an SoC is increased to such proportions that it seriously impacts the available routing resources for data and clock signals. In many designs, the supply grid requires an extra metal layer, which increases production costs. The area required by the supply grid can be reduced if the supply grid is made with narrower wires and if a larger width (and hence lower-resistance) peripheral supply ring is applied around the supply grid. However, the penalty is SoC area. Instead of an area-consuming peripheral supply ring, an increased amount of supply pads can be applied if there is space in the input/output ring. However, the SoC package costs will be increased. If there is no space in the input/output ring, adding supply pads will also increase SoC area.

U.S. Pat. No. 5,767,011 describes a fabrication method for integrated circuits and a resulting structure. The method includes adding power lines and/or increasing the width of power lines and/or adding a power bus near regions of high current flow.

SUMMARY OF THE INVENTION

It is an object of the invention to provide a power supply network for an integrated circuit having a low IR-drop in the power network and a low voltage-rise in the ground network, which minimises the required chip area and/or routing resources for the power supply network.

It has been recognised that the connection between the supply pads and the supply grid is quite small, which means that current spreading into the supply grid is very poor. In accordance with the invention, a more efficient solution (in terms of resource cost and space required) is to improve the conducting fields in the supply grid adjacent to the supply pads. This is achieved using current spreaders which are formed to have a lower electrical resistance than the wires in the supply grid and which connect a number of wires in the internal grid to the supply pads, thereby minimising the routing resources and/or additional silicon area required.

In accordance with a first aspect of the invention, there is provided a power supply network for an integrated circuit, the power supply network comprising a supply grid; a plurality of supply pads, each supply pad being in electrical contact with an edge of the supply grid; a current spreader for at least one of the plurality of supply pads, each current spreader being in electrical contact with a respective supply pad and the supply grid; each current spreader being sized so that it overlaps with a respective portion of the supply grid; and each current spreader having a lower electrical resistance than the supply grid.

The current spreaders in accordance with invention provide an advantage that the IR-drop in the power network and/or voltage-rise in the ground network can be reduced, whilst minimising the required chip area and/or routing resources for the power supply network.

Preferably, each current spreader comprises a metal plate, as this is simple to implement in a power supply network.

Furthermore, it is preferred if the metal plate is slotted, as this reduces the mechanical stress in the power supply network.

In a preferred embodiment of the invention, the supply grid comprises first and second sets of wires, the first set of wires being oriented perpendicularly to the second set of wires.

Preferably, each current spreader comprises metallic strips which are wider than and overlap with the wires in the respective portion of the supply grid. This further reduces the area that the current spreaders occupy in the power supply network.

Preferably, each of the current spreaders is sized such that it extends along the respective edge of the supply grid by a distance that is greater than the distance the current spreader extends into the supply grid from the respective edge, as this minimises the impact of the current spreader on interconnect routing in the integrated circuit.

In one embodiment, the current spreaders are substantially rectangular in shape, as this is very economical and is simple to design.

Alternatively, the current spreaders are substantially semi-circular in shape, as this implementation is very area efficient.

Preferably, there is a current spreader for each of the plurality of supply pads, as this allows the improvement in the IR-drop to be maximised.

Preferably, the power supply network is for supplying power and ground to the integrated circuit.

Preferably, each of the supply pads are for connection to a respective one of a power supply or a ground.

Preferably, in a region in which a current spreader for the power and a current spreader for the ground overlap, the current spreaders are interleaved using a comb structure.

In particular embodiments, the supply grid is formed in one or more metallization layers.

In one embodiment, the current spreaders are formed in the same metallization layer or layers as the supply grid, which means that the resources required for the current spreader are reduced.

Alternatively, the current spreaders are formed in a different metallization layer or layers to the supply grid.

In preferred embodiments, the current spreaders are formed in a post-passivation layer, which provides a very cheap way of decreasing the IR-drop.

In accordance with a second aspect of the invention, there is provided an integrated circuit that comprises a power supply network as described above.

BRIEF DESCRIPTION OF THE DRAWINGS

The invention will now be described, by way of example only, with reference to the following drawings, in which.

DETAILED DESCRIPTION OF THE PREFERRED EMBODIMENTS

As described above, in an integrated circuit or a system-on-chip (SoC), a power supply network is provided to supply the components in the circuit with power from an external power supply. The power supply network comprises a power network and a ground network. In the following, the term "power supply network" is intended to cover either or both of the power network and the ground network. Thus any reference in this specification to IR-drop or an improvement or reduction in IR-drop in a power network is equally applicable to voltage rise or an improvement or reduction in voltage rise in a ground network.

In a conventional power supply network design, the connection between the supply pads and the supply grid is quite small, which means that current spreading in the supply grid is very poor. It is known that reducing the resistance in the supply grid is effective in reducing the IR-drop in the power supply network. However, it has now been recognised that it is only necessary to reduce the resistance of the supply grid near to the supply pads in order to provide an effective improvement in the IR-drop. Therefore, in accordance with the invention, a more efficient solution (in terms of resource cost and space required) is to improve the conducting fields in the supply grid adjacent to the supply pads.

Figure 1:
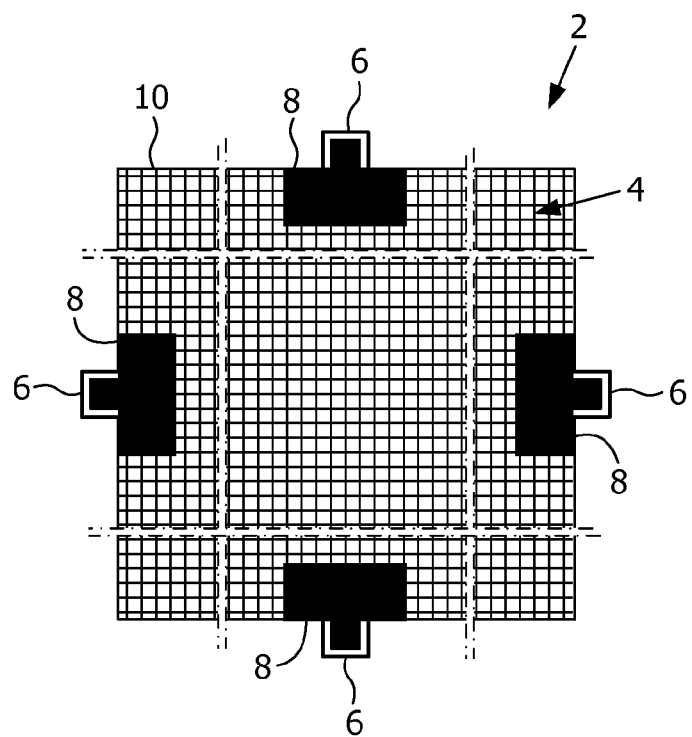
FIG. 1 shows a power supply network in accordance with a first embodiment of the invention.

FIG. 1 shows a power supply network 2 in accordance with the invention. The network 2 comprises a supply grid 4, a plurality of supply pads 6 located around the supply grid 4, each in electrical contact with an edge of the supply grid 4, and a current spreader 8 for each of the plurality of supply pads 6, each current spreader 8 being in electrical contact with a respective supply pad 6 and the supply grid 4. The dash-dot lines in the Figures indicate a break in the drawing. It will be appreciated that the drawings of the power supply network are not to scale.

Although in the following description of the invention each supply pad 6 in the power supply network 2 is illustrated as having an associated current spreader 8, it will be appreciated that in alternative embodiments of the invention, a respective current spreader 8 may be provided only for some of the supply pads 6 in the power supply network 2.

The supply grid 4 comprises a plurality of conducting stripes or wires. Although the supply grid 4 is shown as being substantially square in shape, it will be appreciated that the supply grid 4 can be any required shape.

In this illustrated embodiment, although the supply grid 4 has an outer ring 10 in electrical contact with the other wires in the grid 4, this ring 10 is considerably narrower than a conventional peripheral power ring. For example, in the illustrated embodiment, the outer ring 10 has a width that is comparable or equal to the width of the other wires in the grid 4, whereas a conventional peripheral power ring would be of the order of 50 times the width of the other wires in the grid. As a result of this significant reduction in width, the outer ring 10 should not be considered to be a peripheral power ring.

In an alternative embodiment of the invention, the outer ring 10 may be omitted from the power supply network 2 entirely.

As illustrated, there are four supply pads 6 in this embodiment of the invention, with one supply pad 6 being located towards the middle of each edge of the supply grid 4. In an alternative embodiment of the invention, more than one supply pad 6 per edge of the grid 4 may be provided. In a further alternative embodiment of the invention, the supply pads 6 may be arranged around the supply grid 4 so that one or more edges of the grid 4 does not have a supply pad 6 attached.

As described, a current spreader 8 is provided for each supply pad 6 and is in electrical contact with the supply pad 6 and the supply grid 4. The function of each current spreader 8 is to improve the electrical contact between the supply pads 6 and the supply grid 4, and they are formed so that they have a lower electrical resistance than the wires in the supply grid 4. When viewing the power supply network 2 from above, the current spreaders 8 extend into the supply grid 4 from their respective supply pad 6 and thus overlap with a respective portion of the supply grid 4.

As described above, this grid 4 can be either power or ground, or, if multiple power domains are required, one or more of power1, power2, etc.

The current spreaders 8 may be formed in the same metallization layer as the supply grid 4, in which case the current spreaders 8 are integrally formed with the wires in the supply grid 4. In alternative embodiments, the current spreaders 8 may be formed in a different metallization layer to the supply grid 4, in which case the current spreaders 8 are a separate structure to the wires in the supply grid 4. In further alternative embodiments which are discussed later in more detail, the supply grid 4 may be formed in two or more metallization layers, which means that respective parts of the current spreaders 8 can also be formed in each of those layers.

Figure 2:
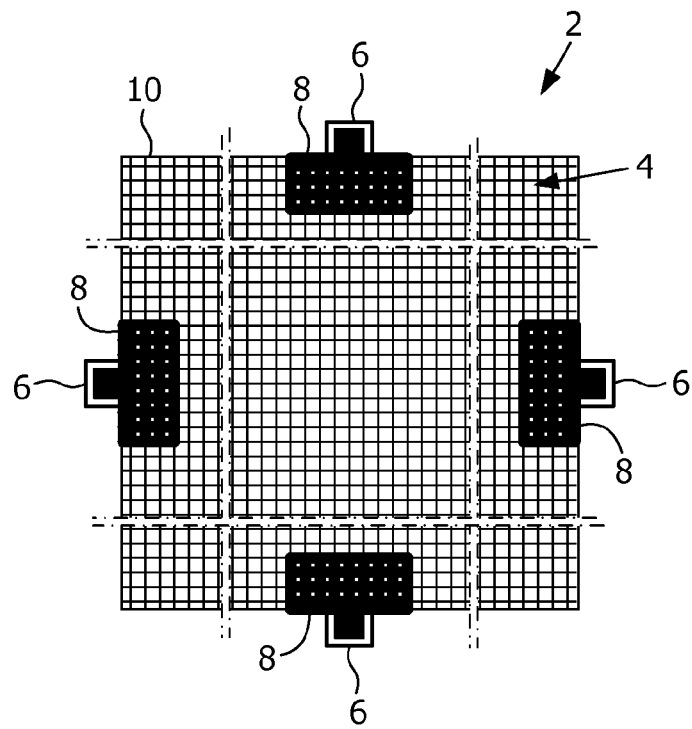
FIG. 2 shows a power supply network in accordance with a second embodiment of the invention.

In the illustrated embodiment, the current spreader 8 is a full metal plate, sized so that it effectively overlaps a portion of the supply grid 4. The full metal plate covers the supply pad 6 completely and extends towards the core area of the integrated circuit. Alternatively, as illustrated in FIG. 2, the full metal plate may have small holes in it to relieve mechanical stress. As a further alternative, the current spreaders 8 can be formed as a grid which may be denser than the supply grid 4. The highest metal density yields the most efficient implementation.

The current spreaders 8 can be patterned in any metallization layer in the integrated circuit process, although it is preferable to use the higher and thicker layers. In one embodiment, the current spreader 8 can be patterned in a post passivation layer which is an extra metal layer that is usually patterned in, but not limited to, point-to-point connections on top of a finished integrated circuit for relocation of the input, output and/or supply pads 6. The post passivation layer may be an aluminium layer. The passivation layer is used to protect the underlying integrated circuit from damage by mobile ions, moisture, transition metals, and contamination. One type of post passivation layer is known as an ALUCAP layer or RDL (redistribution layer).

The current spreader 8 is connected to the supply grid 4 that is associated with the supply pad 6 with vias through the passivation layer. Locating current spreaders 8 in this layer provides a very cheap way of decreasing the IR-drop.

As described above, the current spreaders 8 may be located in the same layer as the supply grid 4 or in other layers within the integrated circuit.

Figure 3:
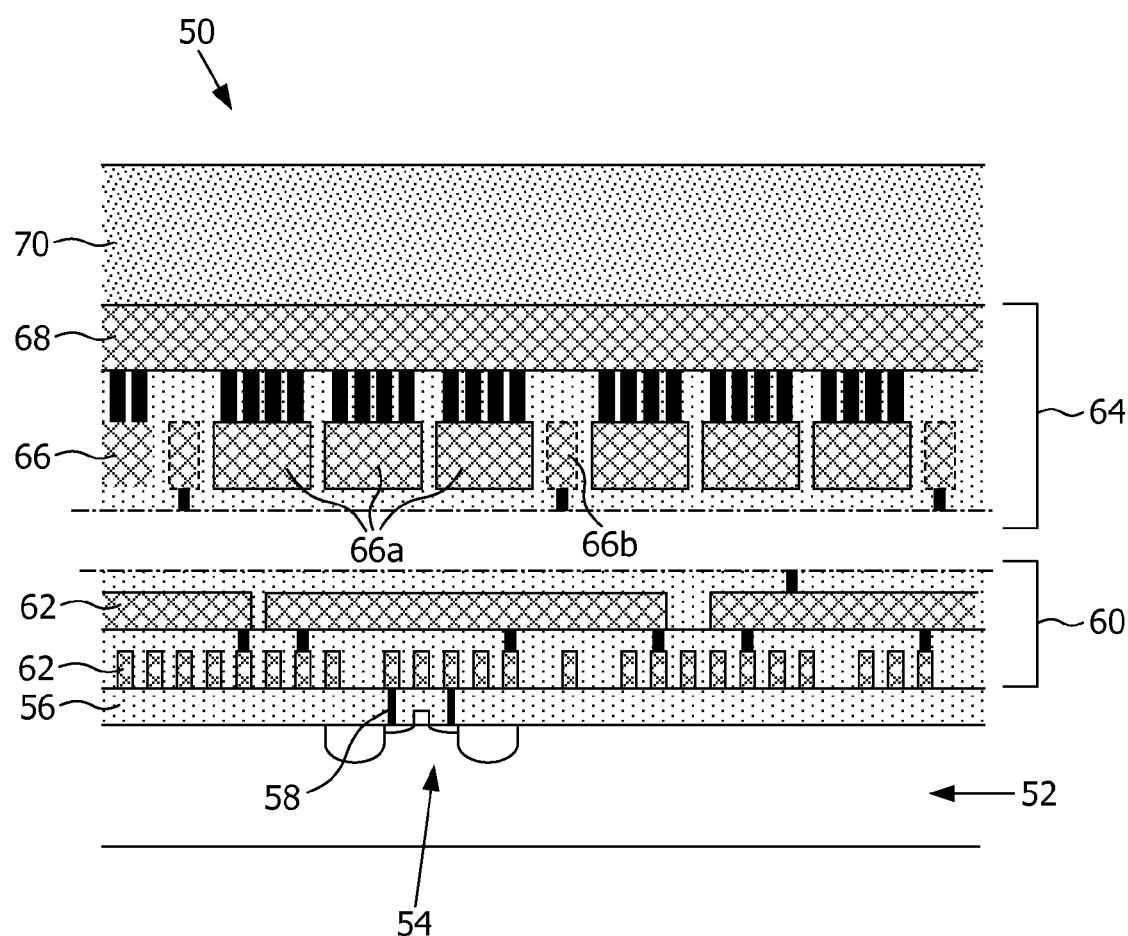
FIG. 3 is a cross-section of an integrated circuit that includes a current spreader in accordance with the invention.

FIG. 3 is a cross-section of an integrated circuit 50 that includes a current spreader in accordance with the invention. In the Figure, which is not to scale, there is a silicon (or other suitable material) substrate 52 in and on which electronic devices 54, for example MOST, bipolar transistors, etc. are formed. In a first dielectric layer 56 above these electronic devices 54 are via contacts 58, which connect the electronic devices 54 to a set of thin metal layers 60 above the dielectric layer 56. In the Figure, via contacts 58 are represented by solid rectangles. These vias 58 form an electrical contact between the electronic devices 54 in the substrate 52 and the set of thin metal layers 60. Interconnect wires 62 are patterned in two of the thin metal layers in the set 60. In a dielectric layer above one of the thin metal layers are via contacts 58 to the next metal layer. These vias 58 form an electrical contact between the wires 62 in one metal layer to the wires 62 in the next metal layer. The set of thin metal layers 60 comprise a number of thin metal and dielectric layers stacked on top of each other.

In general, wires 62 in successive metal layers alternate in the horizontal and vertical directions, which is represented in FIG. 3 with narrow rectangles for wires 62 that run perpendicularly to the surface of the page, and wide rectangles for wires 62 that run parallel to the surface of the page.

On top of the set of thin metal layers 60 is a set of thick metal layers 64. Interconnects 66 and 68 are patterned in a similar way to the interconnects 62 in the set of thin metal layers 60.

In this illustrated embodiment of the invention, the current spreaders are patterned in one or more of the thick metal layers in the set 64. In the Figure, the current spreader is made in the two top metal layers from interconnects 66 and 68. In the top-but-one metal layer, the current spreader wires for power 66a are in sets of three, which are drawn as running perpendicularly to the surface of the page. The ground wires, labelled 66b, and illustrated with a dashed outline, are located between the set of three power wires 66a. The current spreader wire 68 for power runs parallel to the surface of the page, and is located in the topmost metal layer of the set 64. A passivation layer 70 is located on top of the set of thick metal layers 64.

Figure 4:
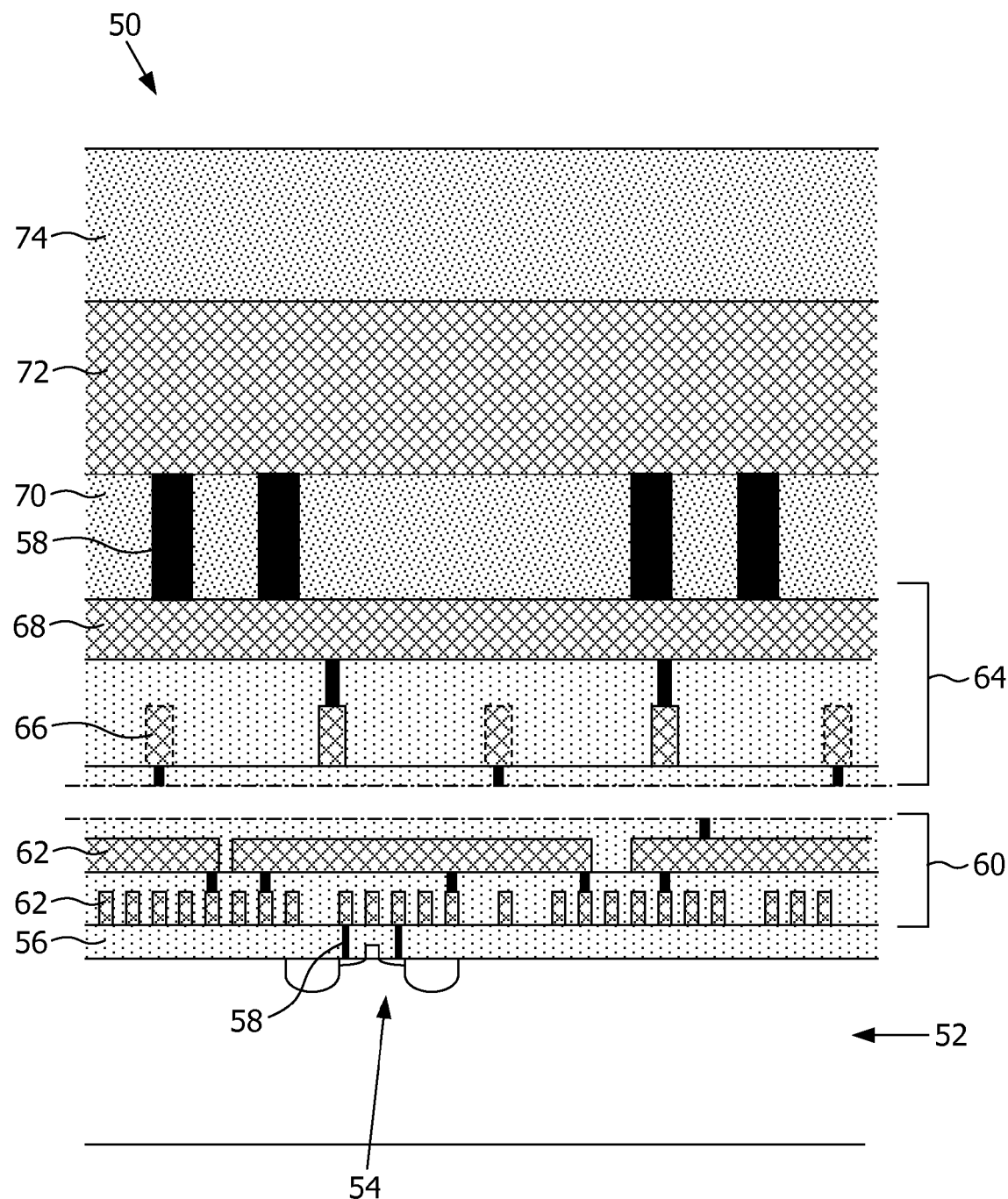
FIG. 4 is a cross-section of an integrated circuit in which the current spreader is patterned in a post passivation layer.

FIG. 4 shows an integrated circuit in which the current spreader is patterned in a post passivation layer. In FIG. 4, elements of the integrated circuit 50 that are common to the integrated circuit in FIG. 3 have been given the same reference numeral.

In this illustrated embodiment, there are vias 58 through the passivation layer 70 which extend to a post-passivation metal layer 72. The current spreader can be formed in this post-passivation metal layer 72. The current spreader can be formed in combination with current spreaders in the set of thin or thick metal layers 60, 64, or can be formed solely in the post-passivation layer 72 which connects to a power grid formed in the set of thin or thick metal layers 60, 64. A further passivation layer 74 is located above the post-passivation layer 72.

Ideally, the current spreaders 8 should be as large as possible. However if the layer or layers in which the current spreaders 8 are patterned is used for other interconnects, the current spreaders 8 must be shaped so that they achieve the most efficient improvement in the IR-drop whilst minimising the impact on the other connections that use that layer. Each current spreader 8 will extend into the supply grid 4 from its respective supply pad 6. It will be appreciated that any shape of current spreader 8 may be used in accordance with the invention, although it is preferable that the current spreaders 8 are wider than they are deep. In other words, it is preferable that the current spreader 8 extends a distance along the edge of the supply grid 4 that is greater than the distance the current spreader 8 extends in towards the centre of the supply grid 4.

For example, in the embodiments of the invention illustrated in FIGS. 1 and 2, the current spreaders 8 have a rectangular shape, with the respective supply pad 6 being located in line with the centre of a long edge of the current spreader 8. A rectangular current spreader 8 is very economical and is simple to design.

Figure 5:
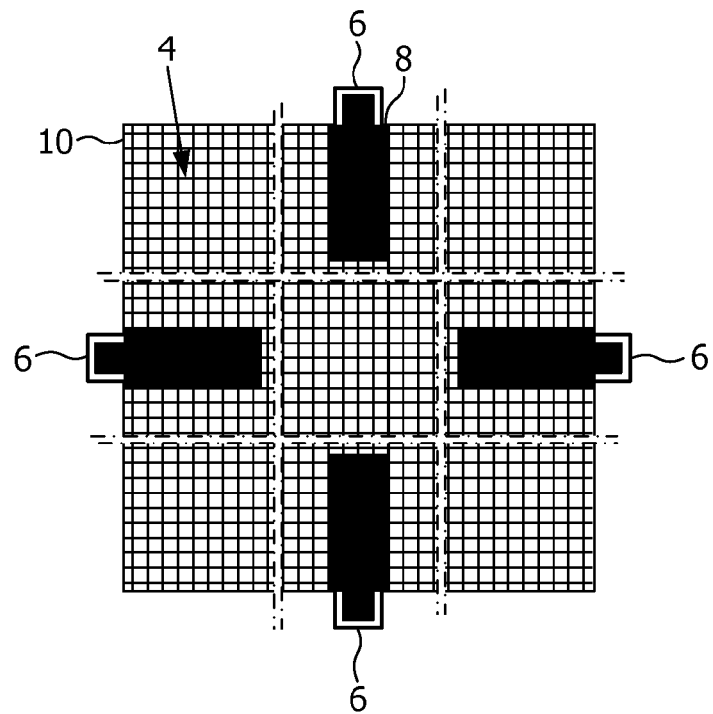
FIG. 5 shows part of a power supply network in accordance with a third embodiment of the invention.

FIG. 5 shows a power supply network 2 in accordance with a third embodiment of the invention. The power supply network 2 is as described above with reference to FIGS. 1 and 2 with current spreaders 8 having a rectangular shape. However, the current spreaders 8 are oriented so that they extend into the supply grid 4 further than they extend along the edge of the supply grid 4. In other words, the current spreaders 8 are deeper than they are wide.

Figure 6:
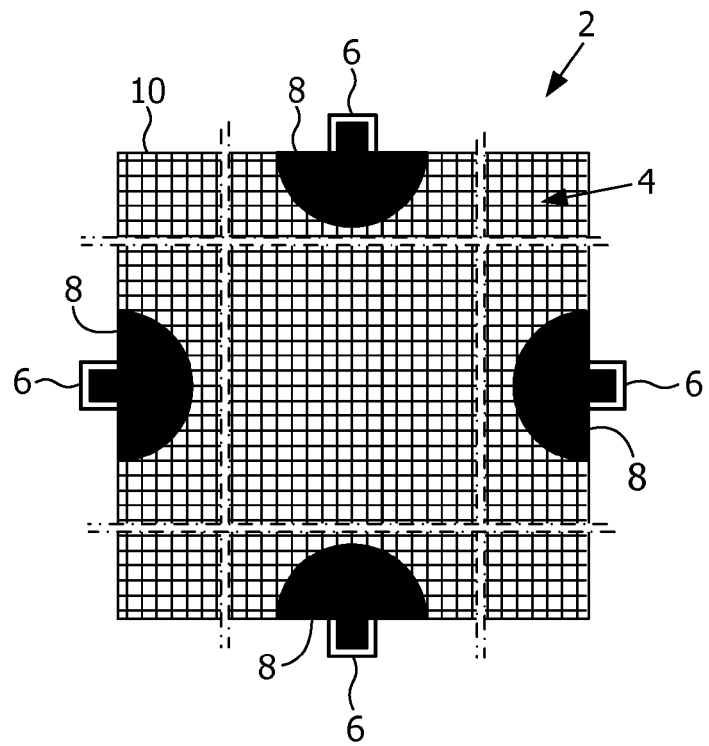
FIG. 6 shows a power supply network in accordance with a fourth embodiment of the invention.

FIG. 6 shows a power supply network 2 in accordance with a fourth embodiment of the invention. The power supply network 2 is as described above with reference to FIG. 1. However, in this embodiment, the current spreaders 8 have a semi-circular profile, with the centre of the circle being located in line with the respective supply pad 6. This implementation of the current spreaders 8 is very area efficient.

Figure 7:
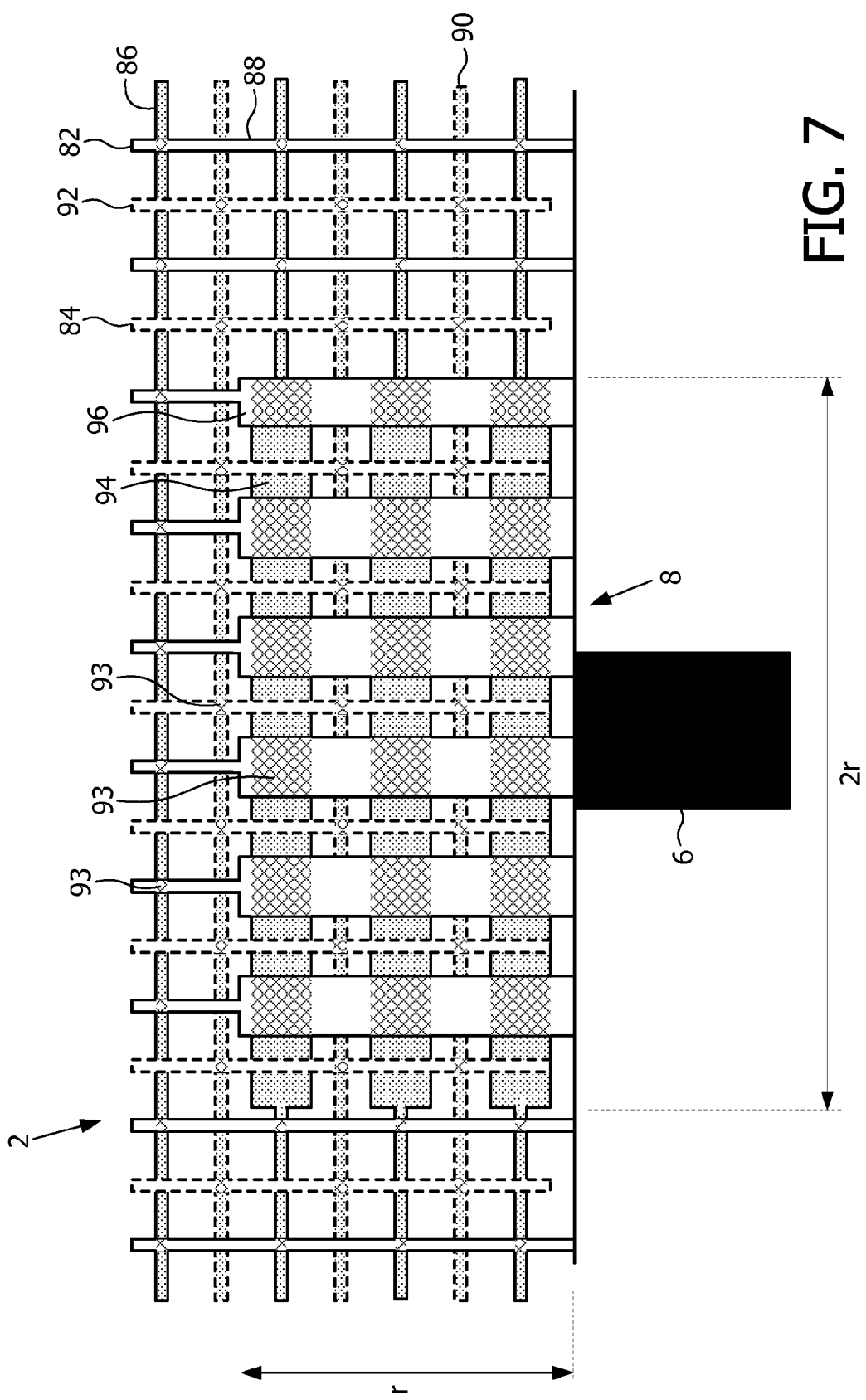
FIG. 7 shows a power supply network in accordance with a fifth embodiment of the invention.

FIG. 7 shows a part of a power supply network 2 in accordance with a fifth embodiment of the invention. In this embodiment, there is a power supply grid 82 and a ground supply grid 84. The power supply grid 82 comprises interconnected horizontal wires 86 and vertical wires 88, and the ground supply grid 84 comprises interconnected horizontal wires 90 and vertical wires 92.

The supply grids 82 and 84 are formed in two separate metallization layers, with the horizontal wires 86, 90 being formed in a first metallization layer and the vertical wires 88, 92 being formed in a second metallization layer above the first layer. The horizontal wires 86, 90 in the first layer are indicated in FIG. 7 with lines that are filled with dots whilst the vertical wires 88, 92 in the second layer are indicated in FIG.

7 with lines that are clear. The wires 86, 88 that form the power supply grid 82 are illustrated with a solid outline, whilst the wires 90, 92 that form the ground supply grid 84 are illustrated with a dashed outline. The power supply grid 82 and ground supply grid 84 are formed by interconnecting the appropriate wires in the two metallization layers with vias 93.

In this illustrated embodiment, a current spreader 8 is provided for the power supply grid 82 which is in electrical contact with a respective supply pad 6 and the power supply grid 82. The current spreader 8 comprises horizontal metallic strips 94 (which are dotted like the horizontal wires 86, 90 in the first layer) and vertical metallic strips 26 (which are clear like the vertical wires 88, 92) that are formed integrally with respective wires in the power supply grid 82. The horizontal and vertical metallic strips 94, 96 are wider than the horizontal and vertical wires 86, 88 in the power supply grid 82, so they therefore have a lower resistance.

Thus, as the power supply grid 82 is formed in two metallization layers, the current spreader 8 is also formed in two layers, with one part of the current spreader 8 (the horizontal metallic strips 94) being formed integrally with the horizontal wires 86 in the first metallization layer and a second part (the vertical metallic strips 96) being formed integrally with the vertical wires 88 in the second metallization layer. The two parts of the current spreader 8 can be interconnected with vias 93 as illustrated, and/or they may both be in separate electrical contact with the respective supply pad 6. The two parts of the current spreader 8 may have the same or a different overall shape, which may depend on the local layer requirements in the integrated circuit.

Each horizontal and vertical metallic strip 94, 96 may comprise a single strip that is much wider than the horizontal and vertical wires 86, 88 as illustrated in FIG. 7, or may comprise a number of parallel strips per wire 86, 88 in the power supply grid 82 that are interconnected to form a composite strip that is much wider than a respective wire 86, 88.

The illustrated current spreader 8 is rectangular in shape, which extends a distance r into the power supply grid 82, and has a width of 2r.

Figure 8:
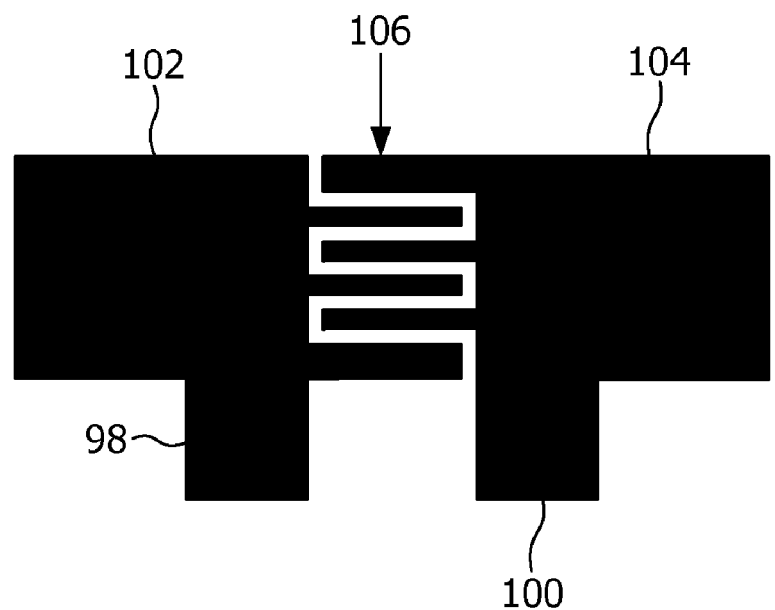
FIG. 8 is a top view of two overlapping current spreaders in accordance with a sixth embodiment of the invention.

FIG. 8 shows a top view of a pair of current spreaders for a power supply grid and a ground supply grid respectively in accordance with a sixth embodiment of the invention. In this embodiment, a power supply pad 98 for a power supply grid is located close to a ground supply pad 100 for a ground supply grid and the preferred areas for the current spreaders 102 and 104 overlap. The current spreaders 102, 104 are located in the same metallization layer, for example the post passivation layer, which means that they must share the common area, so a comb structure 106 is used in the overlapping area. The current spreaders 102 and 104 connect to the underlying power and ground grid with vias.

It will be appreciated that when the current spreaders 102, 104 are each in accordance with the embodiment shown in FIG. 7 (i.e. they are both formed in two layers of the integrated circuit), a separate comb structure 106 is used in the overlapping area of each layer.

The comb structure 106 is preferably sized so that the current spreaders 102, 104 each occupy around 45% of the available area in the overlapping area.

As an example of the effectiveness of the current spreaders in accordance with the invention, consider an integrated circuit as illustrated in FIG. 2. For ease of explanation, the ground grid is not illustrated in FIG. 2, and the supply grid 4 shown in FIG. 2 is considered to be a power supply grid.

The core of electronic circuits and active cells is of size 8.8×8.8 mm². The power grid and a ground grid have been designed in two metal layers of equal thickness and resistivity. The lower metal layer comprises 175 power wires and 175 ground wires in the horizontal direction and the upper metal layer comprises 175 power wires and 175 ground wires in the vertical direction. The pitch between the power wires is 50 μm, and the pitch between ground wires is also 50 μm. The power and ground lines are interleaved, so that the pitch between each subsequent power and ground wire is 25 μm. The width of each power wire and each ground wire in the grid is 5 μm, so that the metal coverage of the power grid is 10% in each layer and the metal coverage of the ground grid is also 10% in each layer.

A power supply pad 6 is provided in the middle of each side of the grid 4. The ground supply pads are not shown. In the following, only the IR-drop of the power grid will be discussed, although similar results are obtained for the voltage rise in the ground supply network.

At each power supply pad 6, a rectangular current spreader 8 has been provided, although the current spreaders 8 are not drawn to scale. In the following example, the current spreaders 8 are removed if a peripheral power ring is applied. Furthermore different shapes of current spreaders 8 are considered with the current spreader 8 being in both layers as in the embodiment described with reference to FIG. 7 or in either one of the two layers.

Five different configurations are considered in this example. The first configuration is a conventional power grid without any current spreaders or a peripheral power ring. This configuration would correspond to that shown in any of FIG. 1, 2, 5 or 6 with the current spreaders 8 removed.

The second configuration comprises a conventional power grid having a power ring with an electrical width of 165 μm, which is 33 times the width of a power wire. Due to technological constraints, the geometrical width is 200 μm. In the following, the peripheral ring is designed around the supply grid, which increases the size to 9.2×9.2 mm². It should be noted that in practice it might be possible for the power ring to be internal to the core, so no increase in area occurs.

The third configuration is a power supply network as shown in FIG. 2. Each supply pad 6 is connected to a rectangular current spreader 8. The layout of the current spreader 8 is substantially as depicted in FIG. 7. The size of each current spreader 8 is 1.1×0.55 mm². The metal coverage in each metal layer is 80% for the power grid. The metal coverage in each layer for the ground grid is 10%.

The fourth configuration is similar to the third configuration, but the current spreaders 8 are rotated by 90°, so that they are oriented as shown in FIG. 5.

The fifth configuration is again similar the third configuration, but the current spreaders 8 correspond in shape to those shown in FIG. 6. The area of each semi-circular current spreader 8 is equal to that of each of the current spreaders 8 in the third and fourth configurations.

Figure 9:
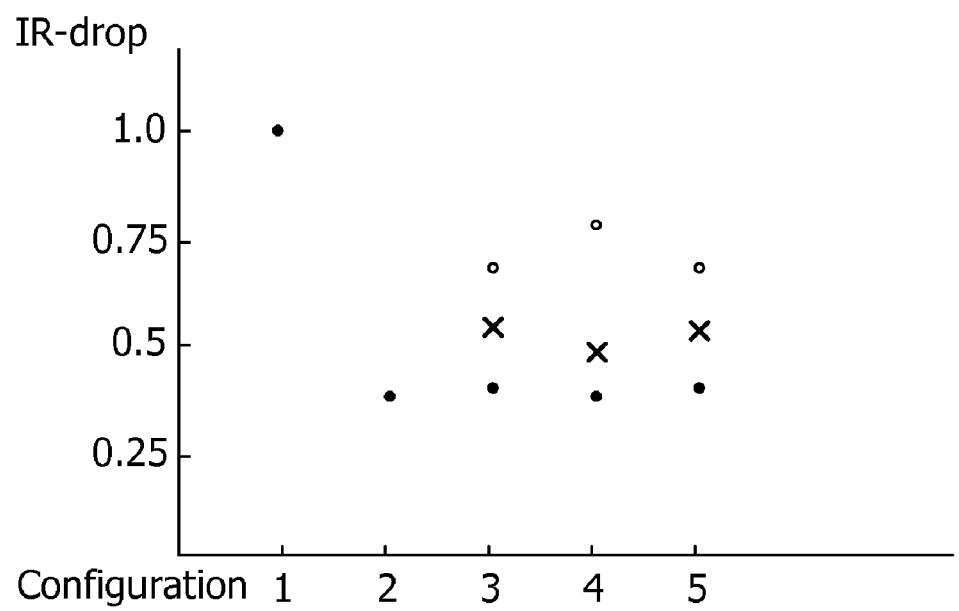
FIG. 9 is a graph showing the difference in IR-drop for five different power supply network configurations.

FIG. 9 is a graphical illustration of the effectiveness of the various configurations in reducing the IR-drop in a power supply network. The different configurations are shown across the horizontal axis of the graph, with the IR-drop shown on the vertical axis. The IR-drop has been normalised so that the IR-drop experienced in the first configuration, which corresponds to a conventional power supply network with no current spreaders or a peripheral power ring, is 1.

It can be seen that there is around a 62% improvement in the IR-drop in the second configuration, which corresponds to a conventional power supply network with a peripheral power ring.

Each of the third, fourth and fifth configurations have been analysed with three different arrangements for the current spreaders 8. The first arrangement corresponds to the structure shown in FIG. 7 in which there are both horizontal and vertical metallic stripes 94, 96. The IR-drop achieved with the first arrangement is represented graphically by a solid dot in FIG. 9.

The second arrangement, whose IR-drop is represented graphically by a cross in FIG. 9, corresponds to a current spreader structure as shown in FIG. 7 with the horizontal metallic strips 94 removed.

The third arrangement, whose IR-drop is represented graphically by a hollow dot in FIG. 9, corresponds to a current spreader structure as shown in FIG. 7 with the vertical metallic strips 96 removed.

It can be seen that a peripheral power ring as in the second configuration reduces the IR-drop by around 62%. It can also be seen that the current spreaders in the third, fourth and fifth configurations reduce the IR-drop by an equivalent amount to the peripheral power ring when the current spreaders are in accordance with the first arrangement.

However, the area required by the peripheral power ring is $4 \times 0.2 \times 8.8$ mm$^2$=7 mm$^2$, whilst the area required by the current spreaders is only $4 \times 0.605$ mm$^2$=2.4 mm$^2$. Thus, the current spreaders provide the same IR-drop as the peripheral power ring whilst using almost 3 times less area.

It can also be seen that current spreaders in accordance with the second and third arrangements reduce the IR-drop by around 50% and 25% respectively with respect to the first configuration. Thus, a current spreader with widened wires directed towards the centre of the supply grid is more effective in reducing the IR-drop than a current spreader with widened wires running parallel to the edge of the supply grid.

It will be noted that this difference is more pronounced for the fourth configuration, but this configuration has the disadvantage that the current spreader extends further towards the centre of the supply grid than the third or fifth configurations, which means that it is more likely to obstruct interconnect routing in the integrated circuit.

However, it will be appreciated that the current spreaders are more effective in reducing the IR-drop when they are in accordance with the first arrangement.

It has also been noted that the full plate current spreaders have properties that are similar to the two layer current spreaders that comprise horizontal and vertical wires.

There is therefore provided a power supply network for an integrated circuit or system-on-chip having a low IR-drop, in which the required chip area and routing resources are minimised. In particular, when there is little routing at the periphery of the integrated circuit, the current spreaders 8 may occupy all of the available metal in the higher metal layers in which the supply grid 4 is patterned, which means that the use of current spreaders 8 will not increase the silicon area required for the integrated circuit. When there are signal interconnects at the periphery of the integrated circuit, the current spreaders 8 may require some additional silicon area, which at most may be equal to the total area of the current spreaders 8.

While the invention has been illustrated and described in detail in the drawings and foregoing description, such illustrations and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A power supply network for an integrated circuit, the power supply network comprising:
    a supply grid;
    a plurality of supply pads, each supply pad being in electrical contact with an edge of the supply grid;
    a current spreader for at least one of the plurality of supply pads, each current spreader being in electrical contact with a respective supply pad and the supply grid; each current spreader being sized over a region so that it overlaps with a respective portion of the supply grid; and each current spreader having a lower electrical resistance than the supply grid, whereby the current spreader is configured to spread current from the respective supply pad over the region.

2. A power supply network as claimed in claim 1, wherein each current spreader comprises a metal plate.

3. A power supply as claimed in claim 2, wherein the metal plate is slotted.

4. A power supply network as claimed in claim 1, wherein the supply grid comprises first and second sets of wires, the first set of wires being oriented perpendicularly to the second set of wires.

5. A power supply network as claimed in claim 4, wherein each current spreader comprises metallic strips which are wider than and overlap with the wires in the respective portion of the supply grid.

6. A power supply network for an integrated circuit, the power supply network comprising:
    a supply grid;
    a plurality of supply pads, each supply pad being in electrical contact with an edge of the supply grid;
    a current spreader for at least one of the plurality of supply pads, each current spreader being in electrical contact with a respective supply pad and the supply grid; each current spreader being sized so that it overlaps with a respective portion of the supply grid; and each current spreader having a lower electrical resistance than the supply grid, wherein each of the current spreaders is sized such that it extends along the respective edge of the supply grid by a distance that is greater than the distance the current spreader extends into the supply grid from the respective edge.

7. A power supply network as claimed in claim 1, wherein the current spreaders are substantially rectangular in shape.

8. A power supply network as claimed in claim 1, wherein the current spreaders are substantially semi-circular in shape.

9. A power supply network as claimed in claim 1, wherein there is a current spreader for each of the plurality of supply pads.

10. A power supply network as claimed in claim 1, wherein the power supply network is for supplying voltage and ground to the integrated circuit.

11. A power supply network as claimed in claim 10, wherein each of the supply pads are for connection to a respective one of a voltage supply or a ground plane.

12. A power supply network as claimed in claim 11, wherein, in a region in which a current spreader for the voltage supply and a current spreader for the ground plane overlap, the current spreaders are interleaved using a comb structure.

13. A power supply network for an integrated circuit, the power supply network comprising:

a supply grid;

a plurality of supply pads, each supply pad being in electrical contact with an edge of the supply grid;

a current spreader for at least one of the plurality of supply pads, each current spreader being in electrical contact with a respective supply pad and the supply grid; each current spreader being sized so that it overlaps with a respective portion of the supply grid; and each current spreader having a lower electrical resistance than the supply grid, wherein the supply grid is formed in one or more metallization layers.

14. A power supply network as claimed in claim 13, wherein the current spreaders are formed in the same metallization layer or layers as the supply grid.

15. A power supply network as claimed in claim 13, wherein the current spreaders are formed in a different metallization layer or layers to the supply grid.

16. A power supply network as claimed in claim 15, wherein the current spreaders are formed in a post-passivation layer.

17. An integrated circuit comprising a power supply network as claimed in claim 1.

18. An integrated circuit as claimed in claim 17, wherein the supply grid in the power supply network is formed in one or more metallization layers of the integrated circuit.

19. An integrated circuit as claimed in claim 18, wherein the current spreaders are formed in the same metallization layer or layers as the supply grid.

20. An integrated circuit as claimed in claim 18, wherein the current spreaders are formed in a different metallization layer or layers to the supply grid.

21. An integrated circuit as claimed in claim 20, wherein the current spreaders are formed in a post-passivation layer on top of the integrated circuit.

* * * * *